(12) United States Patent  
Glossner, III et al.

(10) Patent No.: US 6,269,039 B1  
(45) Date of Patent: Jul. 31, 2001

(54) SYSTEM AND METHOD FOR REFRESHING MEMORY DEVICES

(75) Inventors: Clair John Glossner, III, Carmel; Erdem Hokenek, Yorktown Heights; David Meltzer, Wappingers Falls; Mayan Moudgill, Ossining, all of NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/542,596

(22) Filed: Apr. 4, 2000

(51) Int. Cl.$^7$ .................................................. G11C 7/02
(52) U.S. Cl. .................. 365/210; 365/207; 365/208; 365/149; 365/222
(58) Field of Search .................. 365/210, 207, 365/208, 149, 222

(56) References Cited

U.S. PATENT DOCUMENTS

| | | | |
|---|---|---|---|
| 5,272,676 | 12/1993 | Kubono et al. | 365/222 |
| 5,539,690 | 7/1996 | Talreja et al. | 365/185.22 |
| 5,652,729 | 7/1997 | Iwata et al. | 365/222 |
| 5,852,582 | 12/1998 | Cleveland et al. | 365/222 |
| 5,889,718 | 3/1999 | Kitamoto et al. | 365/210 |
| 6,038,187 | 3/2000 | El Haijji | 365/222 |

OTHER PUBLICATIONS

Cho et al., "A 10 b, 20 Msample/s, 35 mW Pipeline A/D Converter," IEEE Journal of Solid–State Circuits, vol. 30, No. 3, pp. 166–172, Mar. 1995.

*Primary Examiner*—David Nelms
*Assistant Examiner*—Connie C. Yoha (57) ABSTRACT

A volatile memory device, in accordance with the present invention, includes an array of memory cells with at least two dummy cells disposed within the memory array. A driver is included for writing a first state to one of the at least two dummy cells and for writing a second state to another one of the at least two dummy cells. A comparison circuit compares the first state and the second state to a threshold to determine if a refresh of the array of memory cells is needed.

23 Claims, 9 Drawing Sheets

SYSTEM AND METHOD FOR REFRESHING MEMORY DEVICES

BACKGROUND OF THE INVENTION

1. Field of the Invention

The present invention relates to memory devices, and more particularly to dynamic adjustment of a refresh interval of a memory device to minimize the average refresh power of the memory device.

2. Description of the Related Art

Memory devices, such as, dynamic random access memories (DRAMs) include a wide variety of applications. The use of DRAM memory is extremely attractive to many such applications due to its high density and low power access. When used in applications, the power needed to refresh the DRAM becomes a significant part of the standby power of the system. It is well known that the frequency of refresh needed to guarantee stored data integrity is a function of temperature and operating voltage (to the extent that the stored charge is a function of operating voltage). Conventional art usage of DRAM memory ensures refresh rates corresponding to the anticipated worst case values of these conditions. This results in refresh rates much higher than needed for a majority of actual operating conditions.

Hardwired refresh controllers, as used in prior art computer systems, generally lack the flexibility to alter this conventional art approach. However, in many applications the refresh of DRAM may be controlled via more sophisticated refresh controller logic embodied either as special purpose hardware or as a task running on a control or signal processor invoked by a timer event. The approach using a program on an embedded processor is attractive since the approach permits high priority processing to use the memory by deferring refresh while ensuring that the overall refresh rate remains within specifications. Both of these approaches provide flexibility to dynamically adjust the refresh rate, but still do not provide refreshing based on need. Instead, additional unnecessary refreshes are employed which can be expensive in terms of power dissipation, especially in systems, such as mobile systems, which employ batteries.

Therefore, a need exists for a system and method for reducing refresh rates of memory devices. A further need exists for sensing what is a minimum necessary value under current environmental conditions and manufacturing variations to initiate a refresh operation of the memory device.

SUMMARY OF THE INVENTION

A volatile memory device, in accordance with the present invention, includes an array of memory cells with at least two dummy cells disposed within the memory array. A driver is included for writing a first state to one of the at least two dummy cells and for writing a second state to another one of the at least two dummy cells. A comparison circuit compares the first state and the second state to a threshold to determine if a refresh of the array of memory cells is needed.

In alternate embodiments, a sample signal may be provided for enabling an output from the at least two dummy cells to be compared by the comparison circuit at a dynamically adjusted time interval. The dynamically adjusted time interval may include a sampling rate based on a result of a compare of the at least two dummy cells until the result of the compare changes value. The sample rate is preferably equal to a refresh rate of the memory array. The comparison circuit may include a sample signal line for enabling the comparison circuit to compare outputs of the at least two dummy cells. The comparison circuit may include an alert generator to generate an alert signal indicating a refresh of the memory array is needed. The threshold may be set such that discrimination between the first state and the second state stored on the dummy cells may be determined. The volatile memory may be included in a set of memory arrays.

Another volatile memory device, in accordance with the present invention, includes an array of memory cells and at least two dummy cells disposed within the array of memory cells. A write driver is coupled to the at least two dummy cells for writing a first state to one of the at least two dummy cells and for writing a second state to the other one of the at least two dummy cells. A comparison circuit is included for comparing the first state and the second state to a threshold to determine if a refresh of the array of memory cells is needed. A timing control device is also included for enabling outputs from the at least two dummy circuits to the comparison circuit in accordance with a sampling rate.

In alternate embodiments, the sampling rate may be based on a time interval between a last sample and a current sample such that the result of a comparison between the at least two dummy samples of the current sample has a different value than that of the last sample. The sample rate is preferably greater than or equal to a refresh rate of the memory array. The timing control device preferably enables the comparison circuit to compare the outputs of the at least two dummy cells. The comparison circuit may include an alert generator to generate an alert signal indicating a refresh of the memory array is needed. The threshold may be set such that discrimination between the first state and the second state stored on the dummy cells may be determined. The volatile memory may be included in a plurality of memory arrays. The timing control device may include one at least one of a processor, a controller and a logic circuit.

A method for optimizing refresh rate in memory devices, in accordance with the present invention, includes the steps of providing an array of memory cells with at least two dummy memory cells disposed within the memory array and initializing the at least two dummy cells with a first state and a second state of stored charge. A refresh interval for the memory array and a sampling interval for sampling the dummy cells are set. Stored charge of the dummy cells are compared to the threshold, after a sampling interval, to determine if a refresh is needed. The refresh interval is modified in accordance with the step of comparing.

In other methods, the memory array includes a plurality of groups of memory cells and may further the steps of refreshing a group of memory cells and setting a group index to indicate a next group awaiting to be refreshed at the next refresh interval. The step of comparing stored charge of the dummy cells to the threshold, after a sampling interval, to determine if a refresh is needed may include the step of enabling output of the stored charge of the dummy cells to a comparator to determine whether charge has leaked into or out of the dummy cells. The step of modifying the refresh interval may include the step of decreasing the refresh interval by a first increment and the sample interval by a second increment if a refresh is needed. The step of modifying the refresh interval may include the step of increasing the refresh interval by a first increment and the sample interval by a second increment if a refresh is not needed. The method may include the step of refreshing the dummy cells. The step of providing an array of memory cells with at least two dummy memory cells disposed within the memory array may include the step of providing a plurality of arrays of memory cells each including at least two dummy memory cells disposed within the memory array and further comprising the step of selecting an array of the plurality of arrays on which to perform the method steps.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the wing figures wherein.

DETAILED DESCRIPTION OF PREFERRED EMBODIMENTS

The present invention provides a system and method to reduce the refresh rate of a memory device, for example, a DRAM memory device or other volatile memory, to the minimum necessary to guarantee integrity of the stored data. The present invention senses a minimum necessary value under current environmental conditions and manufacturing variations for initiating a refresh operation.

The present invention is illustratively described in terms of a DRAM memory including one or more dummy cells and sensing device whose purpose is to detect the charge leakage rate from the DRAM memory cell capacitors. This charge leakage is determined by comparing the voltage on the storage capacitor of the dummy cell(s) with a value representing the desired minimum charge in the cell holding a logic "1". This minimum value is obtained by setting some dummy cells to logical "0" and some to logical "1" and comparing the charge on the "1" cells to that in the "0" cells plus a threshold offset, or alternatively, (charge on "1" cells minus charge on "0" cells) to a fixed value after waiting for a period of time.

By increasing the time between writing to the dummy cells and sampling until a failure occurs, the needed refresh rate can be determined and the current refresh rate adjusted. If this rate is less than the current rate, the current refresh and sample rates are reduced by some small value. If the rate is greater than the current rate, the current refresh and sample rates are increased by some small value. This permits the actual refresh rate to approach the ideal rate in an over damped fashion to avoid unstable control behavior in the presence of slowly varying environmental conditions. The evaluation of the needed rate is evaluated independently from the actual chip refresh by a separate hardware or software process activated by a timer event.

DRAM memory cells should be refreshed at a rate sufficiently high such that the leakage of charge in the time between refreshes of a given cell does not reduce the amount of stored charge for a logic "1" (assumed the high charge state) to a value of charge in which a sense amplifier cannot discriminate the value from a logical "0" (assumed low state). This is further complicated by the possible leakage of charge into a cell including a logical "0", reducing the sensing margin.

It should be understood that the elements shown in the FIGS. may be implemented in various forms of hardware, software or combinations thereof. For example, the elements shown in FIGS. 5, 6, 7, 9, 10 and 11 may be implemented in software on one or more appropriately programmed general purpose digital processors having memory and input/output interfaces.

Figure 1:
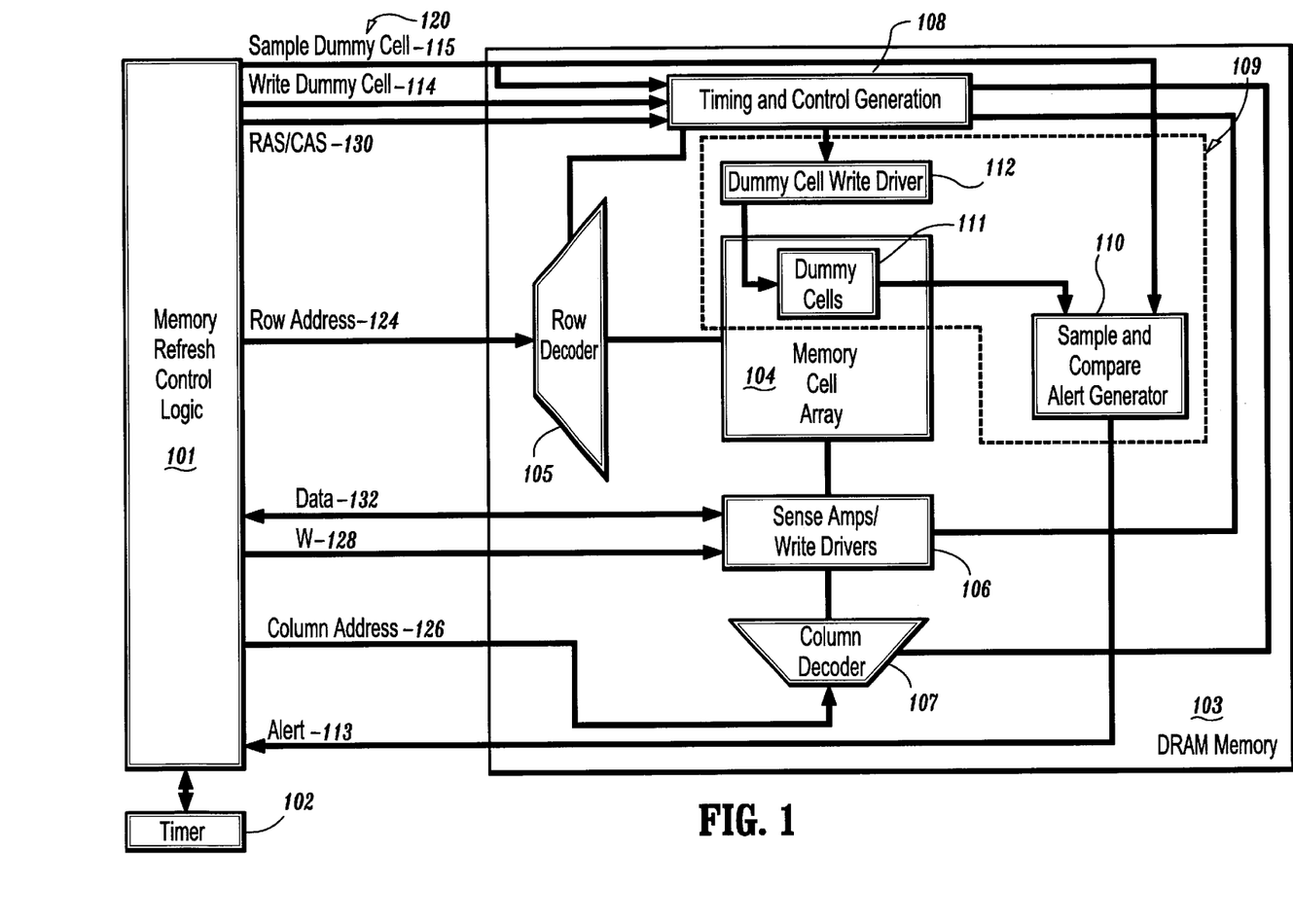
FIG. 1 is a schematic diagram of portion of a memory system including dummy cells in accordance with the present invention.

Referring now to the drawings in which like numerals represent the same or similar elements and initially to FIG. 1, one embodiment of the present invention will be described for refresh controller logic and a single DRAM memory array. Memory refresh controller logic 101 has a timer 102 which is used to generate real time events which invoke actions in the controller 101. A DRAM memory 103 is attached to the refresh controller 101 (and also to a memory user, such as a microprocessor (not shown) via an address/data/strobe interface 120, which is shown with non-multiplexed row and column addresses as would be used in, for example, an embedded DRAM chip. The DRAM memory 103 includes an array of memory cells 104 with appropriate row and column address decoders 105, and 107, respectively. Sense amplifiers and write drivers 106 are also included for the memory array 104 and are employed as is known in the art. Timing and control generation circuits 108 are also provided.

In accordance with the present invention, circuitry 109 is included. Circuitry 109 includes a set of dummy memory cells 111, which are constructed in an identical fashion to the memory cells in the data array 104 and interspersed within the array of memory cells 104. Write drivers 112 are provided to write to the dummy cells 111. A sample and compare alert generator circuit 110 is included to sense the charge in the dummy cells 111.

Three signals are provided in the interface 120 between the logic 101 (which may include a processor) and the DRAM 103 to control the following. A "Write dummy cell" signal 114 controls the write drivers 112 to enable a write operation to the dummy cells 111. A "sample dummy cell" signal 115 controls the sample and compare alert generator 110 which signals the results of a compare via an "alert" signal 113 to the controller 101.

The operation of the rest of DRAM 103 for data access is the same as conventional DRAM. An address composed of a row address 124 and column address 126 is presented to the DRAM 103, together with a value on a W signal 128 (1 for write, 0 for read) and the address is strobed with (row address strobe/column address strobe (RAS/CAS) 130. If a read is to be carried out, the requested data is placed on the Data bus 132 by the DRAM 103. If a write is to be carried out, the data is strobed from the data bus 132 to the array 104.

Figure 2:
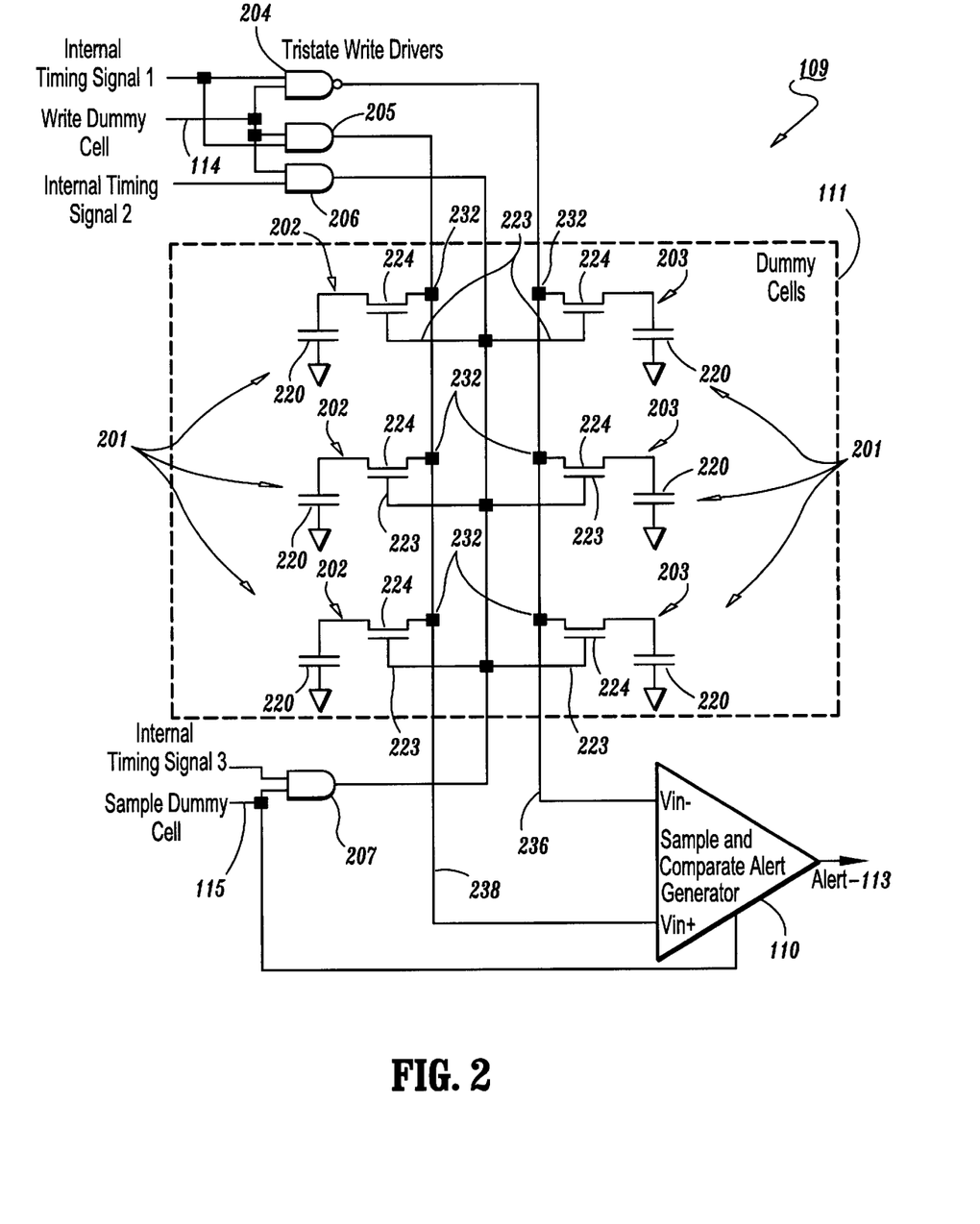
FIG. 2 is a schematic diagram of one embodiment of a charge sensor device for determining when a refresh is needed in accordance with the present invention.

Referring to FIG. 2, circuitry 109 for sensing the optimum refresh interval is shown in accordance with the present invention. A dummy cell array 111 includes at least 2 dummy cells 201. Six dummy cells 201 are illustratively shown in FIG. 2. Dummy cell array 111 is added to the array 104 of FIG. 1. Dummy cell array 111 includes at least one cell (e.g., cells 202) which will be set to a charge level equal to a logic "1" and at least one cell (e.g., cells 203) which will be set to a charge level equal to a logic "0". The actual number of dummy cells 201 and their placement among the cells of the DRAM memory array 104 (FIG. 1) is set so as to maximize the tracking of charge leakage from/to dummy cell storage capacitors 220 with the charge leakage from/to the storage capacitors in the data memory cells of the DRAM array 104 (FIG. 1).

Gate connections 223 of all access transistors 224, corresponding to the "word line" connection of the normal cell array, are connected together and coupled to two tristateable drivers, e.g., a write access driver 206 and a sense access driver 207. Drain connections 232 of the "1" cells' access device 224 are coupled to the Vin+ input of the sample and compare alert generator 110 and to the "1" driver 205. Drains 234 of the "0" cells' access device 224 are coupled to the Vin− input of the sample and compare alert generator 110 and to the "0" driver 204.

To write into the dummy cells 201 to initialize the stored charge value, the write dummy cell signal 114 is asserted. This starts a timing chain in the DRAM 103 which first generates an Internal Timing Signal 1. Internal Timing Signal 1 causes write driver 204 to couple the voltage level representing a logical "0" to a bit line 236 of the "0" dummy cells 203 and causes write driver 205 to couple the voltage level representing a logical "1" to a bit line 238 of the "1" dummy cells 202. Internal Timing Signal 2 then causes driver 206 to turn on the access devices 224 to the cells which couple the voltage on the bit lines 236 and 238 into the storage capacitors thus causing charge to be stored on the storage capacitors 220. The read of the dummy cells 201 transfers this stored charge to the sample and compare alert generator 110. To read the dummy cells, the write dummy cell signal 114 is a logical "0", thereby causes the tristate drivers (204, 205, and 206) to be in a high impedance state, and the sample dummy cell signal 115 is asserted to logical "1". This causes an AND circuit 207 to turn on the access devices 224, in accordance with a Internal Timing Signal 3 and the sample dummy cell signal 115 thereby connecting the storage capacitors 220 to the inputs of the sample and compare alert generator 110 and enabling the generation of the alert signal 113. Internal Timing Signal 3 is preferably sent from timing and control circuitry 108 of DRAM 103 as generated by the sample dummy cells 115 signal input to block 108.

The sample and compare alert generator 110 may operate logically as follows. When the sample dummy cell signal 115 is at logical "0", the generator 110 is preferably in a ready but unarmed state and the alert signal 113 retains the value set at the last compare. When the sample dummy cell timing signal 115 goes to logical "1" the difference in the voltage values from the "1" cells 202 and the voltage value of the "0" cells 203 is compared to a built-in reference value. If the voltage difference of the "1" cells 202 minus the "0" cells 203 is less than the built-in reference value, the comparator asserts the "Alert" signal 113 and retains it until the next compare. The built in reference value may represent the minimum voltage difference at which the sense amplifiers of the memory array can discriminate a stored "1" from a stored "0" in the DRAM cells plus some safety factor to accommodate manufacturing variance. In one embodiment, this reference value may be, for example, between about 100 and about 200 mVolts. The safety factor may be, for example, about 50 mVolts.

A comparator as employed in alert generator 110 preferably has no DC current draw, and permits the built in reference to be a design parameter. It is preferable that the comparator of generator 110 does not require a complex reference voltage generator. Since generator 110 is part of a successive approximation control system, it does not have to have great accuracy requirements. Dynamic comparators are well known in the art and may be used for a comparator included in generator 110. One example is shown in "A 10b, 20 M samples 35 mW Pipeline A/D Converter" by Cho, T. B. and Gray, P. R., IEEE Journal of Solid State Circuits, Vol. 30 Number 3, March 1995, pp. 166–172 (Cho et al.)

Figure 3:
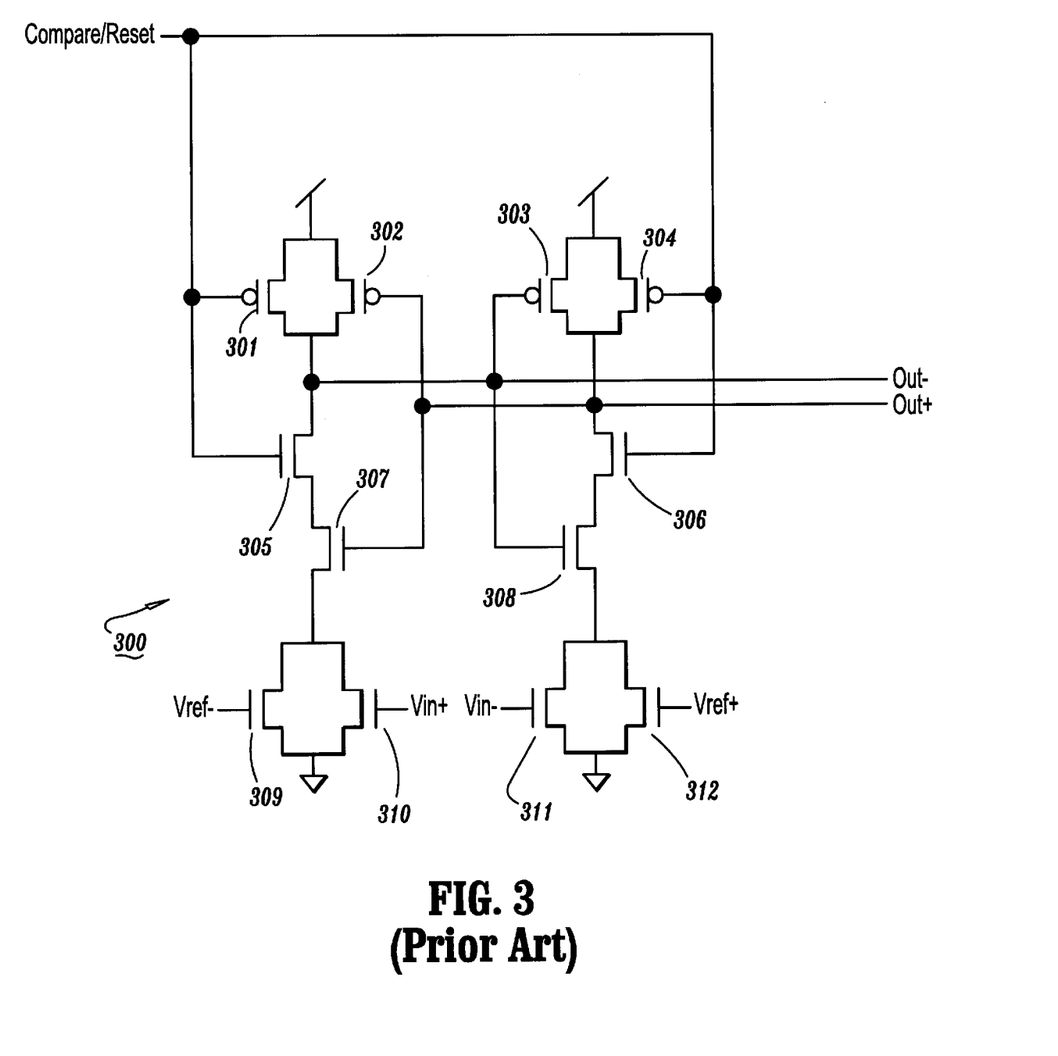
FIG. 3 is a schematic diagram of a conventional comparator which may be employed with the charge sensor device of FIG. 2 in accordance with the present invention.

Referring to FIG. 3, a prior art comparator 300 of Cho et al. which may be employed in generator 110 is schematically shown. When the Compare/reset signal is at Vss, transistors 301, 304, 305, and 306 hold the circuit in the reset state (Out+ and Out− both at Vdd). When the Compare/reset signal goes to Vdd, the transistors 302, 303, 307, and 308 compare the current through transistors 309 and 310 with that through transistors 311 and 312 and are set appropriately. Transistors 309, 310, 311, and 312 are operated in the linear region and thus the current is proportional to the gate voltages, forming a voltage comparator. In accordance with the invention, the Vin terminals are connected to the dummy cell outputs and the reference voltage terminal shown is connected to a suitable reference voltage. The actual value the difference of the Vin terminals is compared against is this Vref value multiplied by a constant determined by the ratio of the widths of transistors 309, 310, 311, and 312. It may thus be adjusted so that whatever convenient Vref is available may be used. Because the act of sampling and activating the comparator takes charge from the dummy cells 201 (FIG. 2), they must be rewritten after the sample. FIG. 3 shows one example of comparator for generator circuit 110 which may be employed in accordance with the invention. Other circuits are also contemplated.

Figure 4:
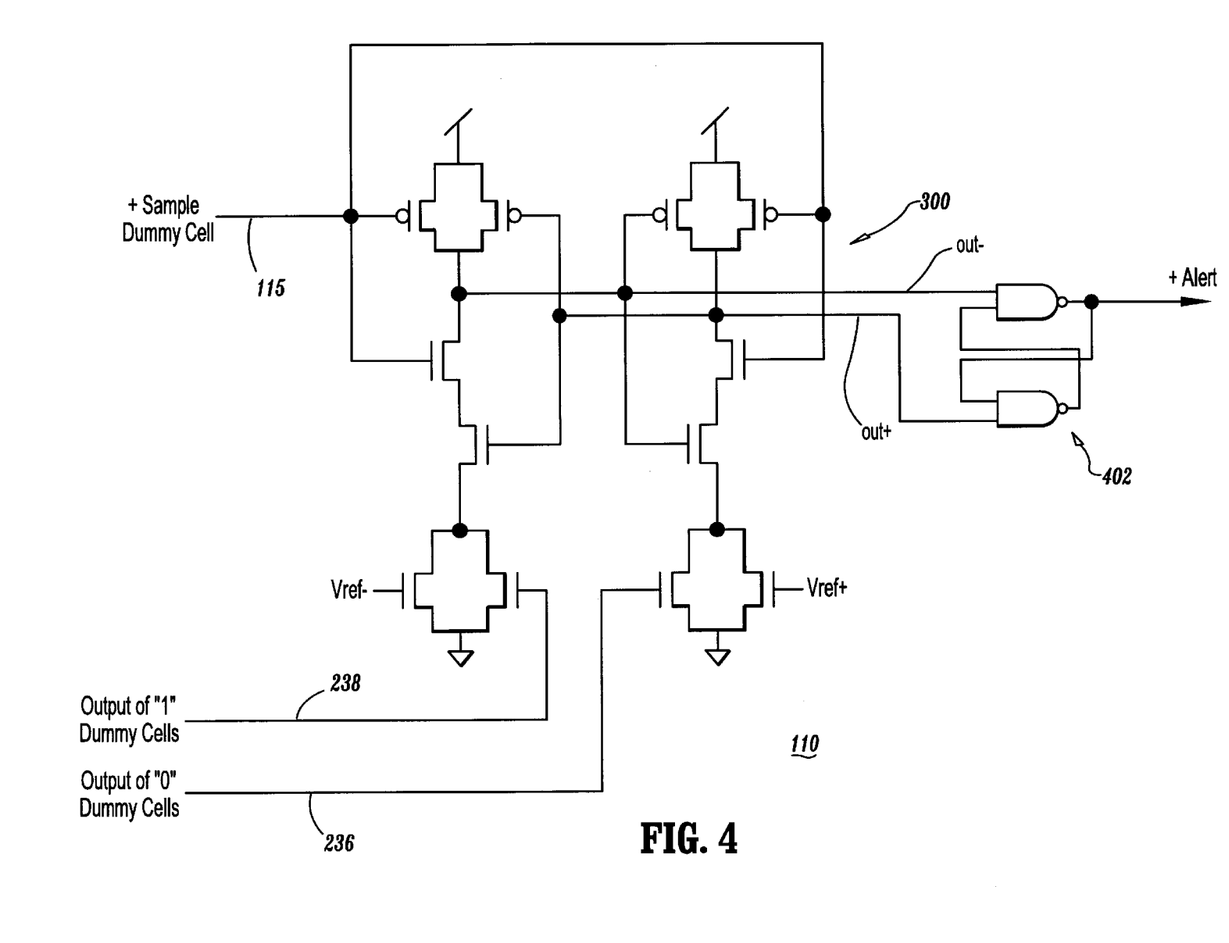
FIG. 4 is a schematic diagram showing an illustrative alert generator in accordance with the present invention.

Referring to FIG. 4, an alert generator 402 for generator 110 which is illustratively employed with the comparator 300 shown in FIG. 3. Generator 110 includes suitable connections to sample dummy cell signal 115 and the outputs of "0" and "1" dummy cells (202 and 203, respectively of FIG. 2). Alert generator 402 may include a static flip-flop device or other storage device which retains the value of the compare when the sample dummy cell signal 115 is logical "0" and both comparator outputs (Out+ and Out−) are high.

Figure 5:
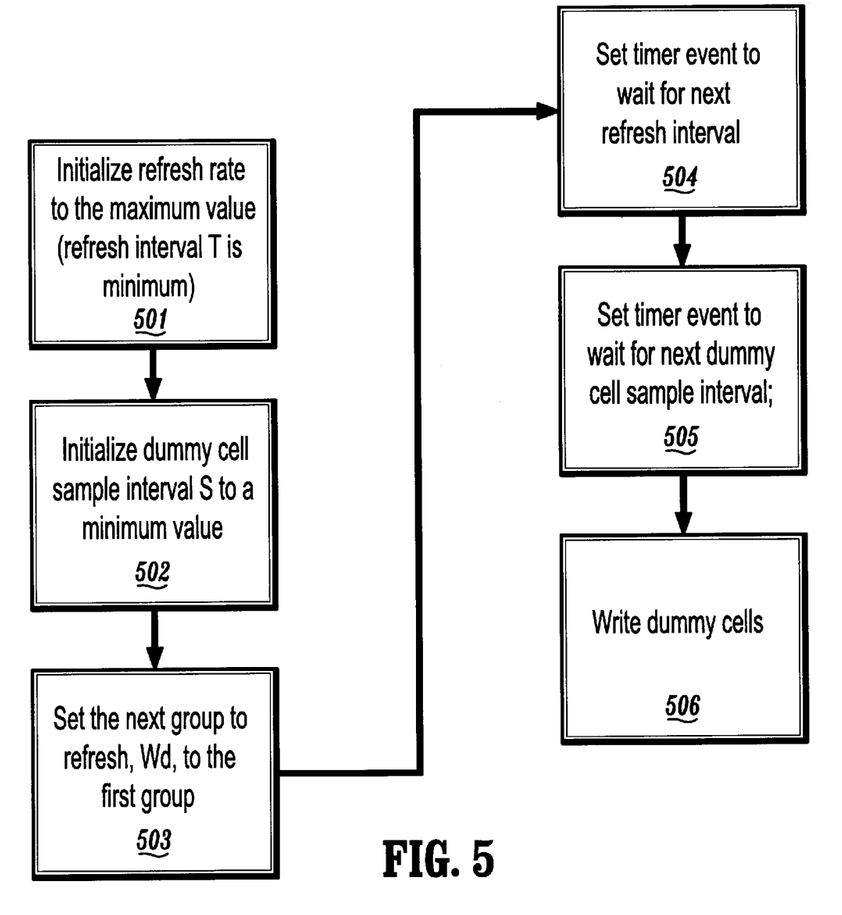
FIG. 5 is a block/flow diagram showing a system/method employed to optimize a refresh rate of the memory device of shown in FIG. 1 in accordance with the present invention.

Referring to FIG. 5, an initialization operation method for adjusting the refresh rate of a memory device is illustratively shown. The method of FIG. 5 is preferably controlled by the refresh control logic 101 of FIG. 1 to vary the refresh rate of the memory device to achieve a minimum refresh rate needed to retain the stored data. The initialization steps in FIG. 5 are invoked whenever the refresh controller 101 (FIG. 1) is initialized such as for a reset or power-on. In block 501, a refresh rate is set for the array and in block 502, a sampling rate is set for the dummy cells. Both the refresh rate and the sampling rate are set to the maximum specified value. The method starts refresh and sample rates at a maximum value permitted by the chip specifications. The refresh rate and the sample rate are both decreased by fixed amounts, for example, incrementally, with the sample rate being decremented faster than the refresh rate until the cell compare fails. Since the refresh rate is still higher than the sample rate, data integrity of the stored data is not compromised. The sample and refresh rates are then adjusted higher. This process will cause the results of the sample to oscillate between fail and not fail. Since the environmental conditions which change the needed refresh rate are slowly changing, this process will advantageously permit the actual refresh rate to track the required rate.

Memory cells in, for example, a DRAM array are divided into groups which are refreshed together. These groups conventionally include all the cells connected to one or more word lines. Each group is enumerated by a unique number value. The numerical value of the next group to refresh is held in a register or control variable Wd (e.g., from "Wordline") in memory refresh logic 101. In block 503, the register or control variable Wd is initialized by setting Wd to the numerical value of the first group. The timer 102 is set to wait for the next refresh interval to cause one event and to wait for the next dummy cell sample interval to cause another event, in block 504. In block 505, the dummy cells 111 (FIG. 1) are written to with the appropriate charge values thereto.

Figure 6:
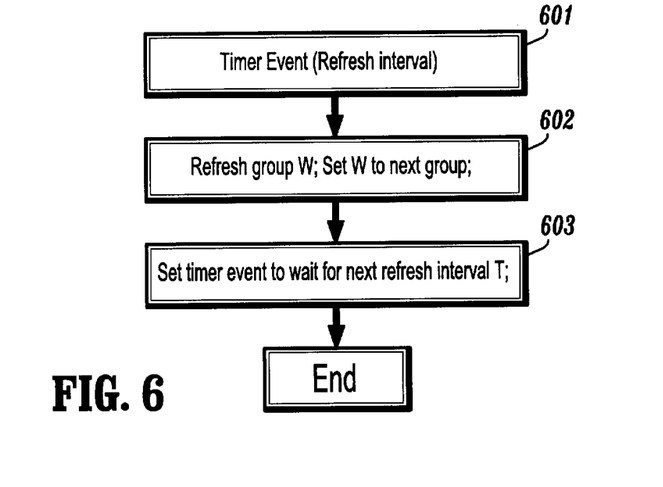
FIG. 6 is a block/flow diagram showing a system/method employed to set a refresh interval in accordance with the present invention.
Figure 7:
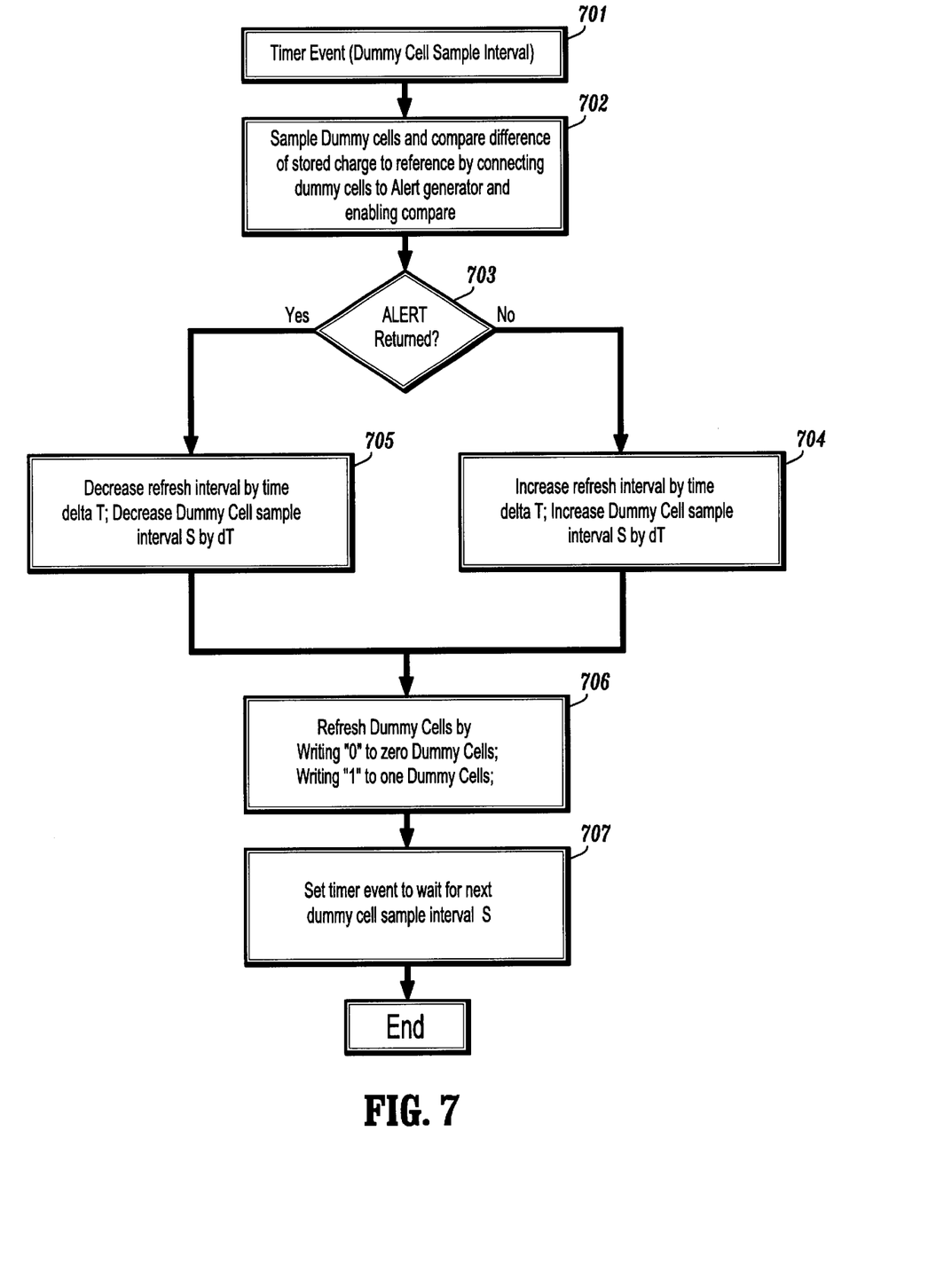
FIG. 7 is a block/flow diagram showing a system/method employed to set a sample interval and adjust the sample interval and the refresh interval in accordance with the present invention.

After the initialization as shown in FIG. 5 is completed, the normal operation of refresh control logic 101 continues as shown in FIGS. 6 and 7. Referring to FIG. 6, a timer event, in block 601, occurs after an interval of time equal to a refresh interval T. In block 602 the timer event causes the refresh of at least one group of cells starting with Wd. Then, Wd is set to the value for the next group of cells to be refreshed. In block 603, the timer 102 (FIG. 1) is then set up to wait for the next refresh interval to cause an event.

Referring to FIG. 7, in block 701, an adjustment of the refresh and dummy cell sampling rates is completed as a result of the dummy cell sample timer event. This method samples the dummy cells, in block 702, using the system described above in FIG. 1, to alert the controller 101 of a need to adjust the refresh rate. Then, in block 703, it is determined whether to adjust the refresh and sample intervals up in block 704 or down in block 705 depending on whether the comparator returned alert or not. Note that in both blocks 704 and 705, the dT value used to adjust the sample interval is not necessarily the same value as deltaT which is used to adjust the refresh rate. After this is done, the dummy cells are written in block 706 to prepare for the next sample interval. In block 707, the timer is set up to wait for the next dummy cell sample interval to cause another event. The sequences of actions by the refresh controller, as shown in FIGS. 6 and 7 are repeated indefinitely as long as the DRAM needs to retain data.

Figure 8:
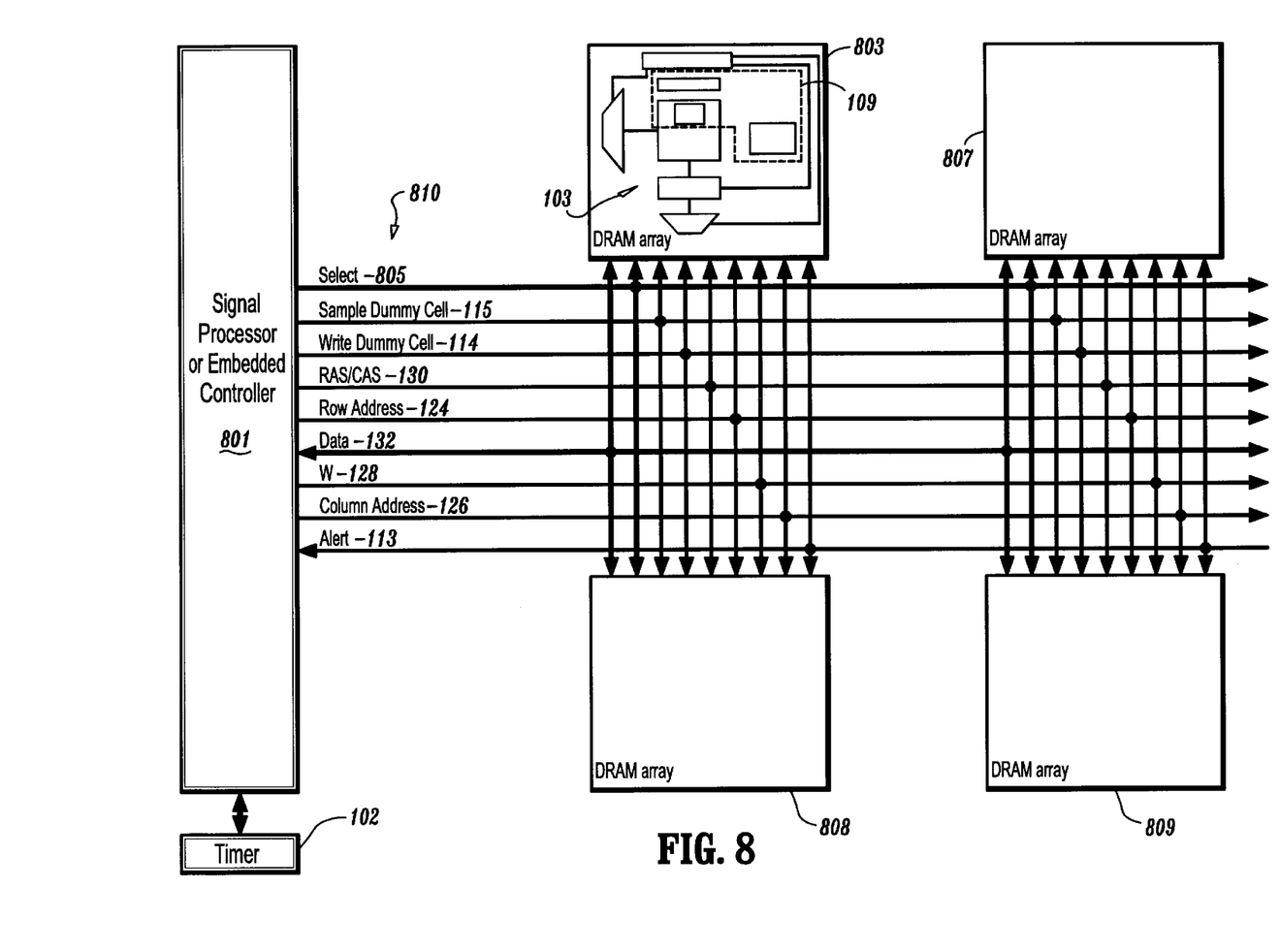
FIG. 8 is a schematic diagram showing a memory system using multiple memory arrays constructed in accordance with the present invention.

Referring to FIG. 8, another embodiment of the present invention is shown in which refresh controller logic has been absorbed into a microprocessor, microcontroller or digital signal processor 801 as a combination of program scheduled tasks and/or hardware for permitting the program to control the signals through an interface 810 to memory 803, 807, 808 and 809. The memory array 103 of FIG. 1 is included in multiple arrays 803, 807, 808 and 809, which may include either separate discrete chips or subarrays on a single chip. Each array (803, 807, 808 and 809) includes the additional hardware or circuit 109 (FIG. 1) for adjusting the refresh rate. Further, arrays 803, 807, 808 and 809 receive all of the control signals described above with reference to FIG. 1.

A select bus 805 may be included for logic signals to select an array (e.g., 803, 807, 808 and 809) to perform address extension, bus arbitration and sharing functions. Microprocessors, microcontrollers or digital signal processors 801 are preferably controlled by an operating system kernel which schedules the allocation of hardware cycles to program processes. The program processes are preferably invoked by the occurrence of events caused either by external signals, the expiration of a wait time or signals from other program processes. One skilled in the art would be able to adapt the methods show in FIGS. 5–7 and 9–11 into the process structure of an operating system kernel.

At the occurrence of an event the kernel running on processor 801 examines the priority and resource requirements of the process to be executed as a result of the event, to determine its position on the queue for use of the processor resources. Each of the timer invoked events associated with the refresh and refresh rate adjustment methods creates a low priority process with a time deadline. As such, the priority is low when the event first occurs, but increases as the deadline approaches.

Figure 9:
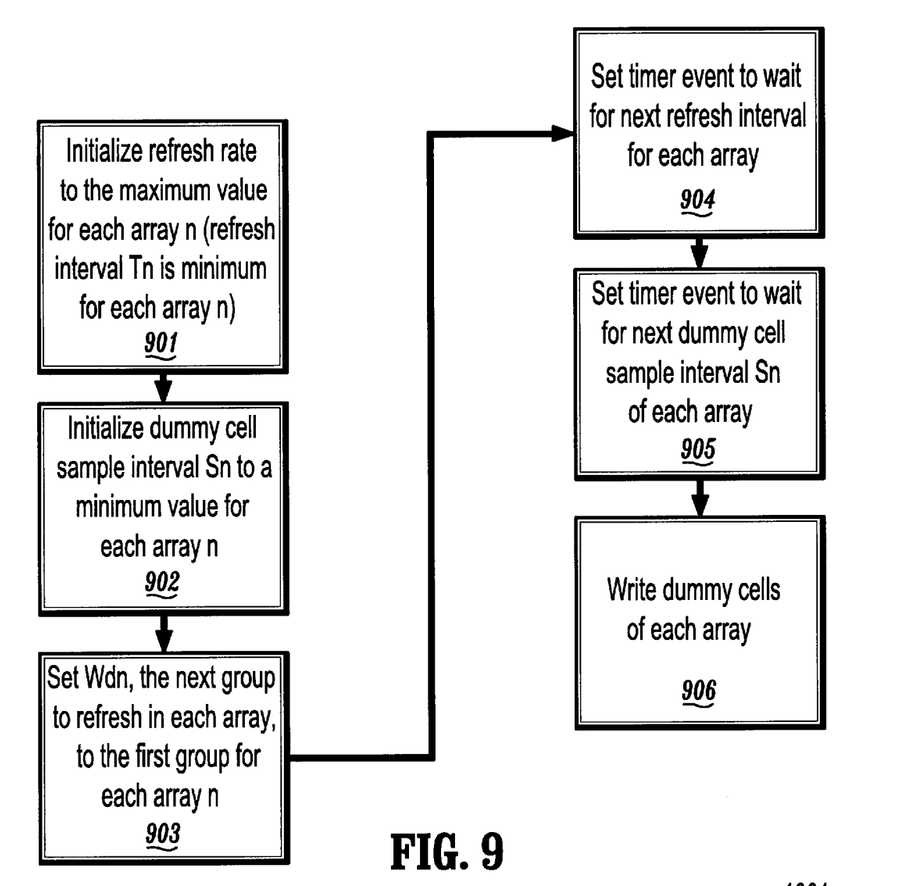
FIG. 9 is a block/flow diagram showing a system/method employed to optimize a refresh rate of the memory device of shown in FIG. 8 in accordance with the present invention.
Figure 10:
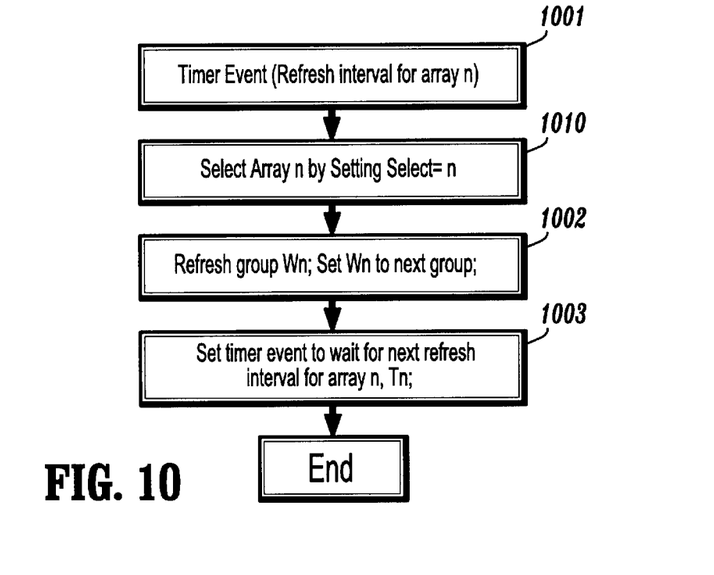
FIG. 10 is a block/flow diagram showing a system/method employed to set a refresh interval for the system of FIG. 8 in accordance with the present invention.
Figure 11:
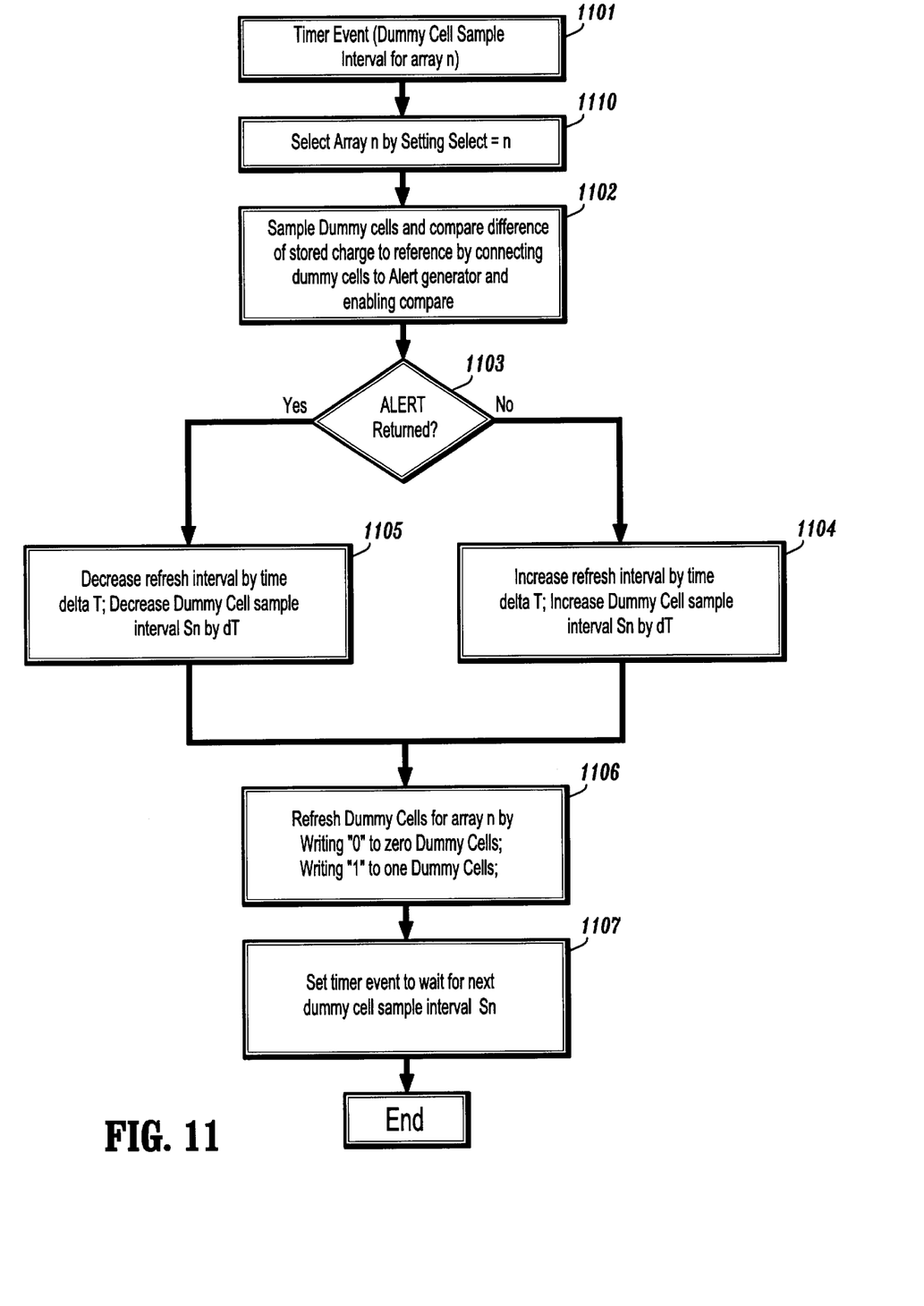
FIG. 11 is a block/flow diagram showing a system/method employed to set a sample interval and adjust the sample interval and the refresh interval for the system of FIG. 8 in accordance with the present invention.

In FIGS. 9, 10 and 11, modifications to the methods of FIGS. 5, 6 and 7 are made for multiple arrays, which are preferably selected by the setting of a select signal on bus 805 (FIG. 8). Referring to FIG. 9, an initialization operation method for adjusting the refresh rate of a plurality of arrays or memory devices is illustratively shown. The method of FIG. 9 is preferably controlled by the processor 801 of FIG. 8 or a program running thereon to vary the refresh rate of the memory device(s) to achieve minimum refresh rate needed to retain the stored data. The steps in FIG. 9 are invoked whenever the program of processor is initialized such as for a reset or power-on. The process is invoked once for initialization and steps through all the arrays, initializing the next group to be refreshed and writing the initial charge into the dummy cells for each array. In block 901, an initial refresh rate is set for each array, and in block 902, an initial sampling rate is set for the dummy cells in each array. Both the refresh rate and the sampling rate are set to the maximum specified value. The method starts refresh and sample rates at a maximum value permitted by the chip specifications. The refresh rate and the sample rate are both decreased by fixed amounts, for example, incrementally, with the sample rate being decremented faster than the refresh rate until the cell compare fails. Since the refresh rate is still higher than the sample rate, data integrity of the stored data is not compromised. The sample and refresh rates are then adjusted higher. This process will cause the results of the sample to oscillate between fail and not fail. Since the environmental conditions which change the needed refresh rate are slowly changing, this process will advantageously permit the actual refresh rate to track the required rate.

Memory cells in, for example, a DRAM array(s) are divided into groups which are refreshed together. These groups conventionally include all the cells connected to one or more word lines. Each group in each array n (e.g., arrays 803, 807, 808 and 809, in FIG. 8) is enumerated by a unique number value. The numerical value of the next group to refresh in DRAM array n is held in a register or control variable Wdn in memory refresh control logic 801. There are n instances of this register or control variable, which for the example of FIG. 8, would be Wd0, Wd1, Wd2, and Wd3. In block 903, each register or control variable is initialized by setting the variable Wdn to the numerical value of a first group to be refreshed. A timer 102 (FIG. 8) is set to create two events associated with each array. The first event is initialized to occur at the next refresh interval (block 904) and the second event after the dummy cell sample interval (block 905). In block 906, the dummy cells 111 (FIG. 9) in each DRAM array are written to with the appropriate charge values.

The two processes represented by FIG. 10 and FIG. 11 are instantiated once for each array so that, e.g., 4 arrays include 8 processes caused by the timer events. Each timer event causes the scheduling of a process in priority order related to the deadline as expressed by the difference of the current time and the expiration time of the refresh interval. The actual execution of each program begins by selecting the array that will be sampled will sample or refresh in blocks 1010 and 1110 in FIGS. 10 and 11 respectively. Other modifications to the previously explained methods of FIG. 6 and 7 for FIGS. 10 and 11 include maintaining a separate refresh and dummy cell sampling interval for each array. This is shown in the FIGS. 10 and 11 as Tn, the refresh interval for array n and by Sn, the dummy cell sample interval for array n. Blocks 601–603 of FIG. 6 correspond to blocks 1001–1003 on FIG. 10, and blocks 701–707 of FIG. 7 correspond to blocks 1101–1107 on FIG. 11. These sequences of actions by the controller/processor 801 are repeated indefinitely as long as the memory arrays need to retain data.

An alternative embodiment provides multiple comparators in generator 110 (FIG. 1) with different threshold values and sampling rates at a fixed time interval. The comparators may form a simple analog to digital converter to measure the charge degradation of dummy cells over the fixed time interval. This permits an alternative method of calculating the required refresh interval.

Having described preferred embodiments of a system and method for refreshing memory devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A volatile memory device comprising:
an array of memory cells;
at least two dummy cells disposed within the array of memory cells;
a driver which writes a first state to one of the at least two dummy cells and writes a second state to another one of the at least two dummy cells;
a comparison circuit which compares the first state and the second state to a threshold to determine if a refresh of the array of memory cells is needed;
a dummy cell sample circuit which samples the first and second states of the at least two dummy cells in accordance with a sample rate which is adjustable based on an output of the comparison circuit; and
a refresh array circuit which refreshes the array of memory cells in accordance with a refresh rate which is adjustable based on the output of the comparison circuit.

2. The volatile memory as recited in claim 1, further comprising a sample signal output by the dummy cell sample circuit for enabling an output from the at least two dummy cells to be compared by the comparison circuit at a dynamically adjusted time interval.

3. The volatile memory as recited in claim 2, wherein the dynamically adjusted time interval includes a sampling rate based on a result of a comparison of the first and second states of the at least two dummy cells until the result of the comparison changes value.

4. The volatile memory as recited in claim 2, wherein the sample rate is equal to a refresh rate of the memory array.

5. The volatile memory as recited in claim 1, wherein the comparison circuit includes a sample signal line for enabling the comparison circuit to compare outputs of the at least two dummy cells.

6. The volatile memory as recited in claim 1, wherein the comparison circuit includes an alert generator to generate an alert signal indicating a refresh of the memory array is needed.

7. The volatile memory as recited in claim 1, wherein the threshold is set such that discrimination between the first state and the second state stored on the dummy cells may be determined.

8. The volatile memory as recited in claim 1, wherein the volatile memory is included in a set of memory arrays.

9. A volatile memory device comprising:
an array of memory cells;
at least two dummy cells disposed within the array of memory cells;
a write driver coupled to the at least two dummy cells for writing a first state to one of the at least two dummy cells and for writing a second state to the other one of the at least two dummy cells;
a comparison circuit which compares the first state and the second state to a threshold to determine if a refresh of the array of memory cells is needed; and
a timing control device which enables outputs from the at least two dummy circuits to the comparison circuit in accordance with a sampling rate, the sampling rate being adjusted in accordance with an alert signal output from the comparison circuit; and
the timing control circuit providing a refresh array signal which refreshes the array of memory cells in accordance with a refresh rate which is adjustable based on the alert signal output from the comparison circuit such that the refresh rate and the sample rate are decreased if the alert signal is output.

10. The volatile memory as recited in claim 9, wherein the sampling rate is based on a time interval between a last sample and a current sample such that the result of a comparison between the at least two dummy samples of the current sample has a different value than that of the last sample.

11. The volatile memory as recited in claim 9, wherein the sample rate is greater than or equal to a refresh rate of the memory array.

12. The volatile memory as recited in claim 9, wherein the timing control device enables the comparison circuit to compare the outputs of the at least two dummy cells.

13. The volatile memory as recited in claim 9, wherein the comparison circuit includes an alert generator to generate the alert signal indicating a refresh of the memory array is needed.

14. The volatile memory as recited in claim 9, wherein the threshold is set such that discrimination between the first state and the second state stored on the dummy cells may be determined.

15. The volatile memory as recited in claim 9, wherein the volatile memory is included in a plurality of memory arrays.

16. The volatile memory as recited in claim 9, wherein the timing control device includes one at least one of a processor, a controller and a logic circuit.

17. A method for optimizing refresh rate in memory devices comprising the steps of:

provliding an array of memory cells with at least two dummy memory cells disposed within the memory array;

initializing the at least two dummy cells with a first state and a second state of stored charge;

setting a refresh interval for the memory array and a sampling interval for sampling the dummy cells;

comparing stored charge of the dummy cells to the threshold, after a sampling interval, to determine if a refresh is needed; and modifying the refresh interval in accordance with the step of comparing.

18. The method as recited in claim 17, wherein the memory array includes a plurality of groups of memory cells and further comprising the steps of:

refreshing a group of memory cells; and setting a group index to indicate a next group awaiting to be refreshed at the next refresh interval.

19. The method as recited in claim 17, wherein the step of comparing stored charge of the dummy cells to the threshold, after a sampling interval, to determine if a refresh is needed includes the step of enabling output of the stored charge of the dummy cells to a comparator to determine whether charge has leaked into or out of the dummy cells.

20. The method as recited in claim 17, wherein the step of modifying the refresh interval includes the step of decreasing the refresh interval by a first increment and the sample interval by a second increment if a refresh is needed.

21. The method as recited in claim 17, wherein the step of modifying the refresh interval includes the step of increasing the refresh interval by a first increment and the sample interval by a second increment if a refresh is not needed.

22. The method as recited in claim 17, further comprising the step of refreshing the dummy cells.

23. The method as recited in claim 17, wherein the step of providing an array of memory cells with at least two dummy memory cells disposed within the memory array includes the step of providing a plurality of arrays of memory cells each including at least two dummy memory cells disposed within the memory array and further comprising the step of selecting an array of the plurality of arrays on which to perform the method steps.

* * * * *